United States Patent [19]

Donner

[11] Patent Number: 4,855,559

[45] Date of Patent: Aug. 8, 1989

[54] ADJUSTABLE HEATER COLLET

[75] Inventor: Joseph E. Donner, Vista, Calif.

[73] Assignee: Hughes Aircraft Company, Los Angeles, Calif.

[21] Appl. No.: 253,159

[22] Filed: Oct. 4, 1988

[51] Int. Cl.[4] .................. H05K 13/04; H05B 3/24
[52] U.S. Cl. .................. 219/85.16; 219/56.1; 219/228; 219/230; 219/233; 219/243; 219/85.18; 228/44.7; 228/180.2
[58] Field of Search ........... 219/56.1, 56.21, 56.22, 219/85 D, 85 F, 85 CA, 85 CM, 158, 161, 228, 230, 233, 234, 243; 228/6.2, 44.7, 180.2; 29/740, 741, 760, 762, 839, 840

[56] References Cited

U.S. PATENT DOCUMENTS

| | | | |
|---|---|---|---|
| 3,230,338 | 1/1966 | Kawecki | 219/85 D |
| 3,529,760 | 9/1970 | Hickman et al. | 228/51 |
| 3,632,973 | 1/1972 | O'Keefe | 219/230 |
| 3,673,384 | 6/1972 | Burman et al. | 219/230 |
| 3,990,863 | 11/1976 | Palmer | 29/203 B |
| 4,022,370 | 5/1977 | Durney | 228/5.1 |
| 4,255,644 | 3/1981 | Delorme | 219/233 |
| 4,436,242 | 3/1984 | Shisler et al. | 228/264 |
| 4,528,746 | 7/1985 | Yoshimura | 29/743 |
| 4,599,037 | 7/1986 | Ross, Jr. et al. | 414/752 |
| 4,654,507 | 3/1987 | Hubbard et al. | 219/233 |

*Primary Examiner*—A. D. Pellinen
*Assistant Examiner*—David Osborn
*Attorney, Agent, or Firm*—Joseph E. Szabo

[57] ABSTRACT

An adjustable heater bar arrangement (8) for integrated circuit attachment and removal apparatus including a base plate having four slots (14) in which heater bars (12) are slidably mounted and held in position by clamping screws (18). By directing the slots (14) at an appropriate angle, inward and outward movement of the heater bars (12) is accompanied by lateral movement of each heater bar (12), such that the device (8) may be adjusted to accommodate large and small sized ICs (13A, 13B), as well as lot-to-lot variations between ICs (13A, 13B). For example, to accommodate a square IC (13A, 13B), each slot (14) extends outward at an acute angle of 45 degrees, respectively, with reference to the sides of a substantially rectangular base plate (10).

11 Claims, 5 Drawing Sheets

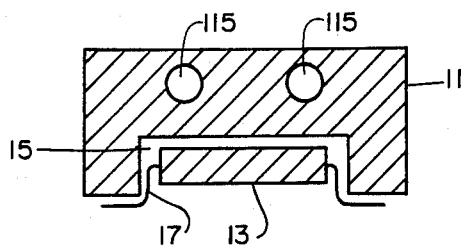
FIG. 1
(PRIOR ART)
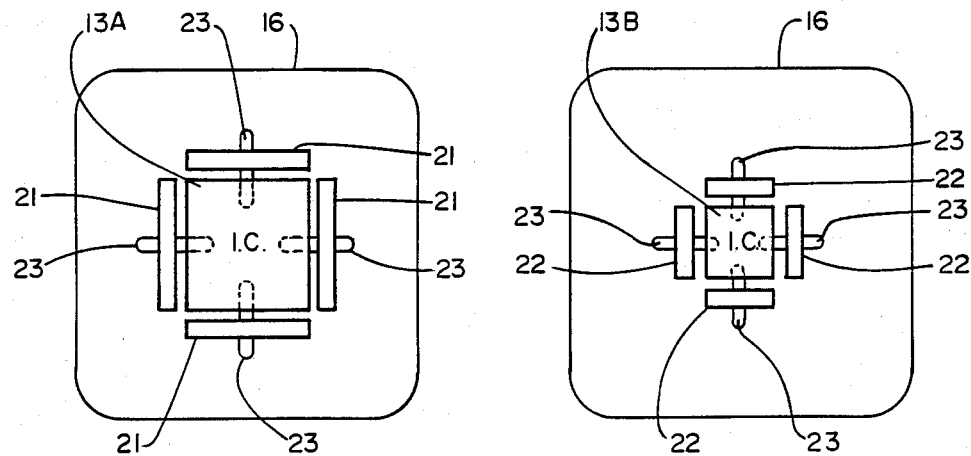
FIG. 2A
(PRIOR ART)
FIG. 2B
(PRIOR ART)

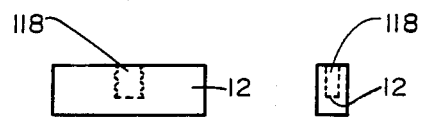
FIG. 7A   FIG. 7B
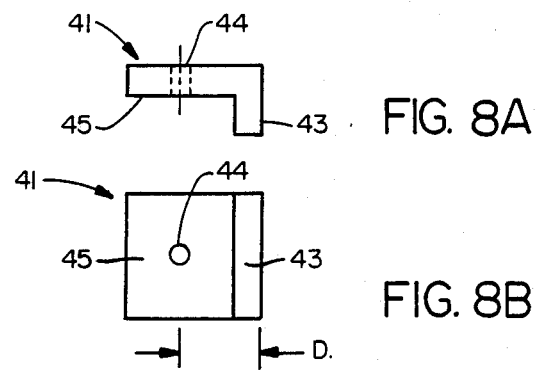
FIG. 8A
FIG. 8B
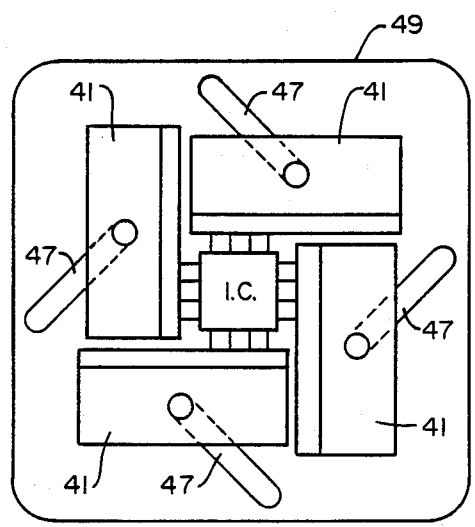
FIG. 9

ADJUSTABLE HEATER COLLET

BACKGROUND OF THE INVENTION

1. Field of the Invention

The subject invention relates to integrated circuit attachment and removal apparatus, and more particularly to apparatus suitable for the attachment or removal of gull-wing-type quad pack integrated circuits from printed circuit boards.

2. Description of the Prior Art

In recent years, many devices and methods have been developed relating to the attachment of components to a printed circuit board. Examples of such joining processes include wave soldering, infrared radiant soldering, vapor phase soldering and hot bar soldering.

The impetus behind the development of such joining processes is in part due to the advent of multi-leaded electronic components. Over the past years, electronic components have advanced from components with two leads, like resistors, capacitors, etc., to integrated circuits with 10 to 100 or more leads. The leads on such integrated circuits typically emerge from the body of the IC from two or four sides of the device. On a "gull-wing" device, each lead extends outward from the side of the device, bends downward so as to form a knee, and then bends outward once again to form a foot suitable for attachment to a pad on the metallized surface of a printed circuit board.

Because of advances in technology that allow increasingly sophisticated circuitry to reside in a single IC, it is often necessary to use ICs having leads extending from all four sides. Such ICs are commonly referred to as "quad packs." The attachment and removal of quad packs has proven to be far more difficult than the attachment and removal of Dual-in-Line ICs.

Successful attachment of quad packs using current hot bar technology requires localized application of heat, sufficient to reflow the solder on the IC leads without reflowing the solder on nearby ICs. The successful removal of a quad pack requires that all of the leads be heated simultaneously and equally until all of the solder becomes liquid. The mass joining processes of wave soldering, infrared radiant soldering, and vapor phase soldering are not suitable for removal of quad packs because such processes do not allow for selectively melting the solder on the leads of the IC to be removed while not melting the solder joints of other components on the printed circuit board.

One prior art hot bar device provides a specifically-sized, closely toleranced monolithic cavity created from a single piece of metal. The monolithic cavity is placed over an IC such that the cavity surrounds and makes thermal contact with leads of the quad pack. Such monolithic cavity devices have two drawbacks. First, they are limited to use with ICs of a single size. Second, their fixed dimensions make it extremely difficult to accommodate the small but bothersome variations in dimensions of a particular IC that invariably occur from lot to lot. Such dimensional variations cause various problems. For example, if the so-called knee-to-knee dimensions of the leads of a gull-wing-type quad pack are too large, the device will not fit the cavity. If the knee-to-knee dimensions are too small, the loose fit will result in poor thermal contact between the heated walls of the cavity and the leads of the quad pack.

To overcome the inability of monolithic hot bar devices to accommodate the relatively small lot-to-lot variations in IC size, a prior art device having a base plate and four slidably adjustable heater bars situated orthogonally to one another has been provided. Each heater bar is machined to match the corresponding length of each side of a quad pack. This arrangement compensates for small variations in IC dimensions by providing tracks or slotted guides to allow for relatively minute adjustment of the heater bars. Because inward movement of one pair of the heater bars will interfere with the movement of the other pair of heater bars, the range of adjustment in such an arrangement is typically limited to ±0.015 inch. Although this adjustable heater bar arrangement provides a solution to the problem of lot variances in the dimensions of a particular device, it requires that a different set of heater bars be fabricated and maintained to accommodate each new device of different nominal dimensions. Additionally, inherent and costly delays are involved in procuring and changing the heater bars for different devices.

SUMMARY OF THE INVENTION

It is an object of the invention to provide an improved apparatus for attaching and removing integrated circuits;

It is another object of the invention to provide heater bar apparatus for IC attachment and removal which is adaptable to accommodate various-sized ICs, as well as accommodate lot-to-lot variations in ICs of a particular size.

According to the invention, an improved heater bar arrangement is provided wherein guide means for the heater bar elements provide lateral motion of the heater bars parallel to the sides of an IC at the same time as the heater bars move inwardly toward the IC. The guide means are arranged appropriately with respect to one another such that the heater bar elements do not contact one another for a considerable distance as they move inward toward the IC. In this manner, a single adjustable heater bar arrangement is provided which accommodates both large and small ICs and permits the finer adjustments required to accommodate lot-to-lot variations in IC size.

BRIEF DESCRIPTION OF THE DRAWINGS

The just-summarized invention will now be described in detail in conjunction with the drawings, of which:

FIG. 1 is a cross-sectional view of a prior art monolithic heater bar device shown in relation to the leads of a gull-wing-type quad pack;

FIGS. 2A and 2B are bottom views of two differently-sized prior art heater bar devices, each of which is slightly adjustable so as to compensate for minute variations from a particular nominal size;

FIGS. 7A and 7B are respective side and front views of a heater bar for use in the preferred embodiment;

FIGS. 8A and 8B are respective side and bottom views of an alternative heater bar embodiment for use in the preferred embodiment;

FIG. 9 is a bottom view of an alternate embodiment employing the heater bars of FIGS. 8A and 8B;

DETAILED DESCRIPTION OF THE PREFERRED EMBODIMENT

Figure 3A:
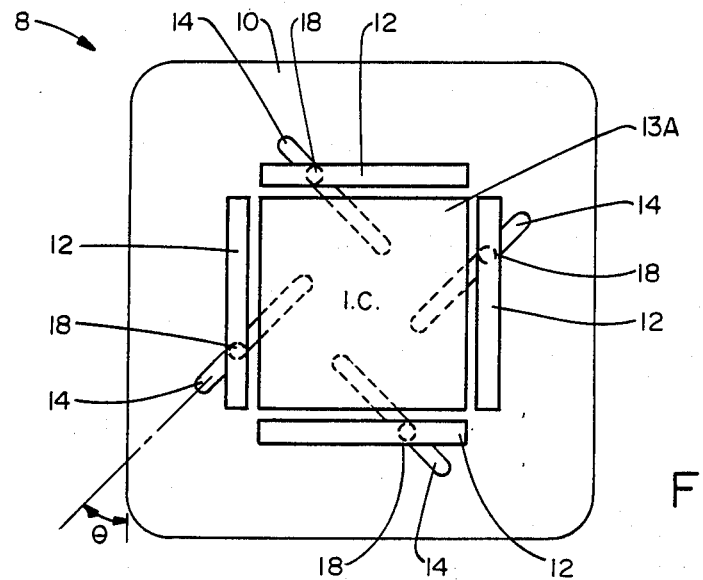
FIG. 3A is a bottom view of the heater bar apparatus of the preferred embodiment with the heater bars adjusted to form the largest possible cavity.

The process of attaching and removing gull-wing-type quad packs has typically been accomplished with the use of a specifically-sized, close tolerance single-piece or "monolithic" cavity device 11, including two heater cartridges 115, as illustrated in FIG. 1. The device 11 is placed over the quad pack IC 13 such that the cavity 15 surrounds and makes thermal contact with the leads 17 of the quad pack 13. As mentioned, such monolithic cavity devices 11 have proven to be troublesome in that it is extremely difficult to allow for the small but bothersome variations in IC dimensions that invariably occur from lot to lot, and in that an entirely different device is required for an IC of different size.

FIG. 2A illustrates a prior art heater bar arrangement having a base plate 16 and four adjustable sliding heater bars 21 situated orthogonally to the base plate 16 so as to form a slightly adjustable cavity. Each heater bar 21 is machined to match the corresponding length of each side of the quad pack 13A and is held in position by a clamping screw (not shown). This arrangement compensates for small variations in IC dimensions by providing tracks or slotted guides 23, which allow for relatively minute adjustment of the heater bars 21. Because, in this arrangement, inward movement of one pair of heater bars 21 will interfere with the movement of the other pair of heater bars 21, the range of adjustment is typically limited to ±0.015 inch. Although this arrangement provides a solution to the problem of lot variances in the dimensions of the particular device 13A, it requires that a different set of heater bars be fabricated and maintained to accommodate each new device of different nominal dimensions. FIG. 2B illustrates such a different set of heater bars 22 riding in guides 23 in a base plate 16 to accommodate lot variances in a smaller IC 13B.

Figure 3B:
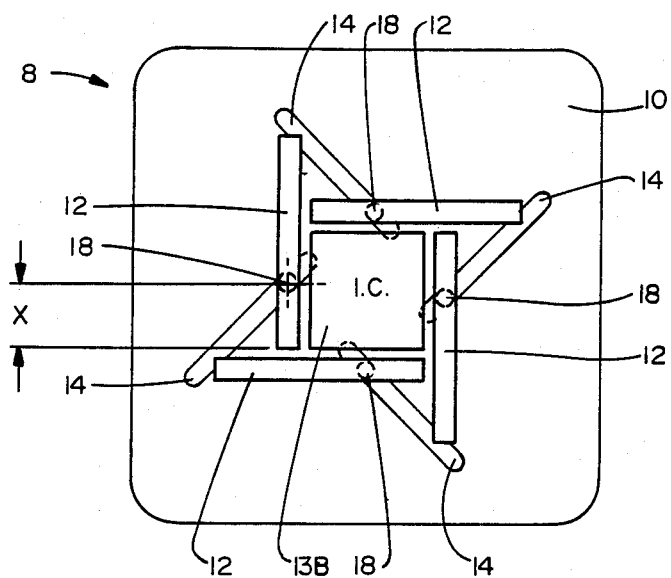
FIG. 3B is a bottom view of the embodiment of FIG. 3A with the heater bars readjusted to fit a small IC.

As shown in FIGS. 3A and 3B, the improved heater bar assembly 8 of the preferred embodiment includes a rectangular metal base plate 10 having four tracks in the form of slots 14 therein. The base plate 10 is typically rectangular, but may be formed in other shapes. Four metal heater bars 12 are orthogonally attached to the base plate 10 by way of four screws 18 extended from the opposite side of the base plate 10 through the base plate 10 such that an adjustable, substantially rectangular cavity is formed between the interior sides of the four heater bars 12.

As further illustrated in FIGS. 3A and 3B, the slots 14 are cut in the base plate 10 in such a configuration that an inward or outward movement of a heater bar 12 toward or away from the IC 13A, 13B results in a corresponding lateral movement of the heater bar 12 parallel to the side of the IC 13A, 13B adjacent the particular heater bar 12. To accommodate a square IC 13A, 13B such as that shown in FIGS. 3A and 3B, the slots extend outward at an angle, e.g., $\theta$, of 45 degrees, with respect to the side of the base plate 10.

The length of each heater bar 12 corresponds to the maximum length of a particular side of the largest integrated circuit 13A for which the heater bar 12 may be used. Adjustment for the smallest IC is limited by the position of each clamping screw 18 relative to the end of the heater bar 12, i.e., distance "X" on FIG. 3B. The length of the slots 14 is selected to be long enough to handle both extremes.

Figure 4:
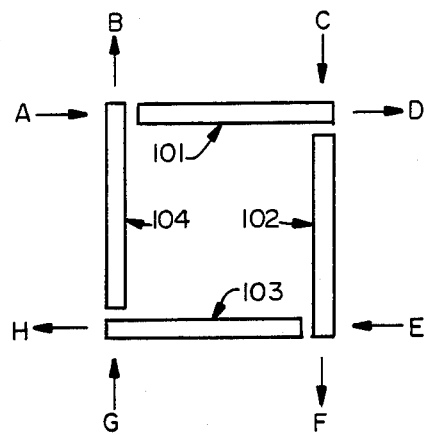
FIG. 4 is a schematic useful in illustrating the design of the preferred embodiment.
Figure 5:
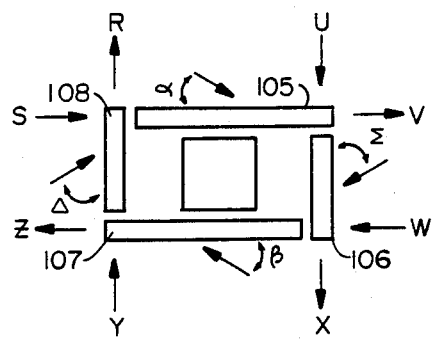
FIG. 5 is a second schematic useful in illustrating the design of the preferred embodiment.

The angle of the slots 14 is dictated by the consideration of maintaining a controlled clearance between the heater bars. For example, consider the square cavity shown in FIG. 4, employing heater bars 101, 102, 103, 104. While adjusting the heater bars 101, 102, 103, 104 inward, movement of the heater bar 101 in the direction C must equal movement of heater bar 102 in direction F; movement of the heater bar 104 in the direction A must equal movement of the heater bar 101 in the direction D; and so forth, such that $A=D$, $C=F$, $E=H$ and $G=B$. For a square IC, $A=C=E=G$, resulting in a slot angle of 45 degrees. FIG. 5 illustrates a rectangular cavity having heater bars 105, 106, 107, 108. For a rectangle with an aspect ratio of 2:1, $S=W=2U=2Y$ and the included slot angles $\alpha, \beta$ are 26.6 degrees, and the included slot angles $\Delta$, $\Sigma$ are 63.4 degrees. In general, for a rectangle, angle $\alpha$ = angle $\beta$, and angle $\Delta$ = angle $\Sigma$.

The heater bar assembly 8 illustrated in FIGS. 3A and 3B operates as follows: The square cavity created between the interior walls of the four heater bars 12 is adjusted by first loosening the four clamping screws 18 extended through the slots 14 cut in the base plate 10. The four heater bars 12 are then adjusted so that the cavity corresponds to the dimensions of the integrated circuit 13A, 13B for which the attachment or removal operation is to be performed. Such adjustment can be accomplished by using either standard measuring devices or by simply bringing the adjustable heater bar assembly 8 into contact with the IC 13A, 13B to be removed and manually adjusting the four heater bars 12 so as to contact the leads of the integrated circuit 13A, 13B. Such adjustment, of course, involves loosening and retightening of the clamping screws 18. Once the foregoing adjustment is accomplished, the heater bars 12 of the adjustable heater bar assembly 8 are brought to a temperature sufficiently high to liquefy the solder so that the attachment or removal operation may be performed.

Figure 6:
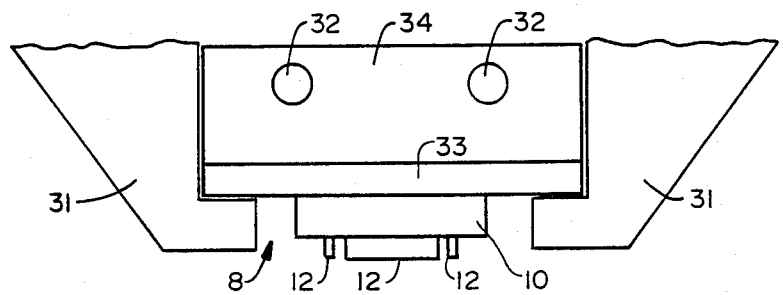
FIG. 6 is a side view of hot ram reflow apparatus in which the preferred embodiment may find use.

FIG. 6 illustrates a portion of a typical hot ram reflow soldering apparatus in which the preferred embodiment may be employed. As shown, jaw members 31 are provided for retaining a heat transfer plate 33 against a heater block 34. The heat transfer plate 33 mounts the base plate 10 of the preferred embodiment. A heater cartridge 32 supplies heat through the heater block 34 to the heat transfer plate 33. Such apparatus typically includes positioning apparatus for raising and lowering the heater block 34, heat transfer plate 33 and heater bar assembly 8 into position over an IC. Other variations and applications of the preferred embodiment will be apparent to those skilled in the art.

In a removal operation, the cavity formed by the four heater bars 12 is brought down around the IC to be removed such that the interior face of each heater bar 12 makes thermal contact with the leads extending from the respective sides of the IC 13A, 13B. The adjustable heater bar assembly 8 may be further lowered so that the lower side of each heater bar 12 will be simultaneously caused to contact the plane formed by the upper surfaces of the leads of the IC 13A, 13B. Once the solder attaching the leads of the IC 13A, 13B has been liquefied, a vertical force may be applied to the IC 13A, 13B by an appropriate lifting means such as, for example, a vacuum.

The slot positioning in FIG. 3B assumes a heater bar structure wherein a threaded mounting hole 118 is located in the bar 12 above the soldering surface, as further illustrated in FIGS. 7A and 7B. Alternate heater bar shapes are, of course, possible. For example, FIGS. 8A and 8B show an alternate L-shaped heater bar 41 where the mounting hole 44 is located in the leg 45 of the heater bar 41, with its center at a distance D from the edge of the foot 43 of the bar 41.

An alternate embodiment employing the heater bars 41 of FIGS. 8A and 8B is shown in FIG. 9. Again, the four heater bars 41 are mounted to ride in slots or guides 47 in the base plate 49. Comparing the embodiment of FIG. 9 to that of FIG. 3B, it may be noted that the slots 47 of FIG. 9 are moved closer to the perimeter of the base plate 49 by the dimension "D." In the design of FIG. 9, the slots 41 do not come close to the edge of the cavity containing the IC.

Figure 10:
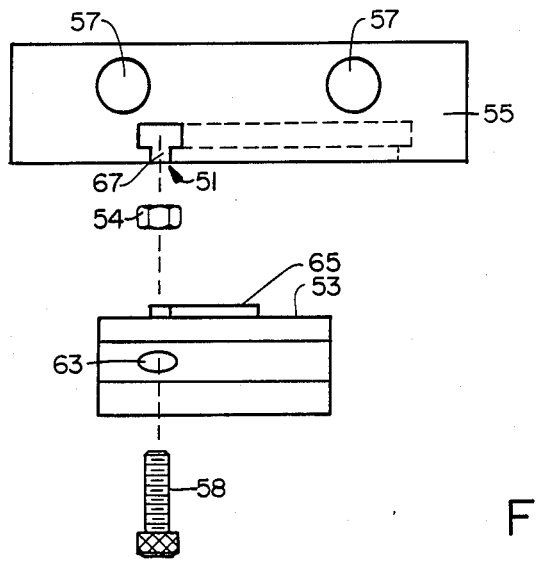
FIG. 10 is a side assembly view of an alternate embodiment employing "T"-shaped guide tracks.
Figure 11:
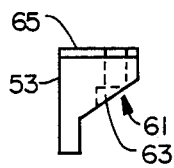
FIG. 11 is a side view of the heater bar shown in FIG. 10.
Figure 12:
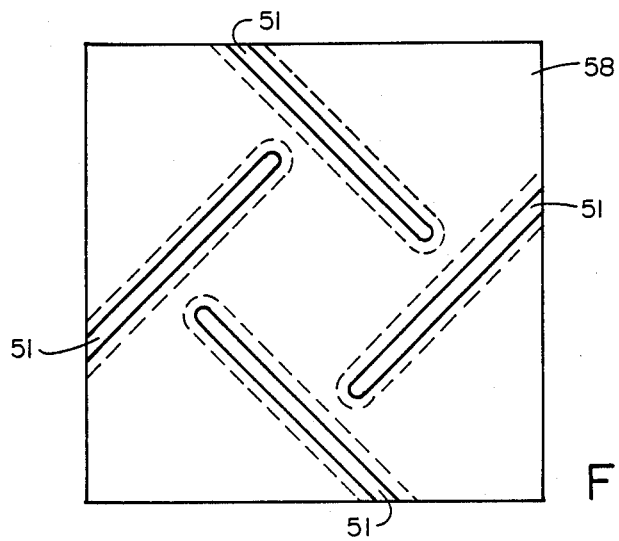
FIG. 12 is a bottom view of a heater block schematically illustrating positioning of T-shaped guide tracks.

It may further be observed that the tracks used to mount and guide the heater bars may take forms other than the slots 14 shown in FIGS. 3A and 3B. FIG. 10 illustrates an embodiment employing "T"-shaped recesses to mount the heater bars 53. FIG. 10 shows a heater block 55 having heater cartridges 57 mounted therein and a "T"-shaped recess 51. A travelling nut 54 rides in the recess 51. The heater bar 53 is attached to the travelling nut 54 by a screw 58 inserted through a hole 63 in the heater bar 53. The heater bar 53 also has a guide bar 65 on the top surface thereof. The guide bar 65 rides in the lower or base portion 67 of the T-shaped recess 51. The heater bar 53 has a profile as shown in FIG. 11 including a wedge-shaped portion 61 wherein the mounting hole 63 is located. A layout of T-shaped recesses 51 at 45-degree angles to the sides of a base plate or heater block 58 is schematically illustrated in FIG. 12.

The foregoing discussion illustrates variations and adaptations of the preferred embodiment. Numerous other modifications and adaptations may be made by those skilled in the art without departing from the spirit and scope of the invention as set forth in the following claims. Therefore, it will be understood that, within the scope of the appended claims, the invention may be practiced other than as specifically described herein.

What is claimed is:

1. A heater bar assembly for removal or replacement of integrated circuits from a circuit board, comprising:
    a base plate;
    a plurality of heater bars; and
    means for mounting said heater bars to said base plate and guiding said heater bars towards or away from an integrated circuit such that an inward or outward adjustment of said heater bars towards or away from respective sides of said integrated circuit is accompanied by a corresponding lateral movement of each heater bar substantially parallel to the said sides of the integrated circuit.

2. The assembly of claim 1 wherein the plurality of heater bars comprises first and second pairs of heater bars, the heater bars of each pair lying on parallel, spaced-apart axes, the axes of one pair lying at an angle with respect to the axes of the other pair.

3. The assembly of claim 2 wherein the sides of said integrated circuits lie on a square and wherein the axes of each said pair of heater bars lie at a 45-degree angle to one of said sides.

4. The assembly of claim 1 wherein the plurality of heater bars comprises four heater bars whose interior sides form a substantially rectangular cavity.

5. The assembly of claim 1 wherein the mounting and guiding means includes a set of tracks in said base plate.

6. The assembly of claim 5 wherein the plurality of heater bars comprises four heater bars situated so as to form a substantially rectangular cavity between the interior sides of the heater bars.

7. The assembly of claim 6 wherein said base plate is substantially rectangular and said plurality of slots comprises four slots at an angle of approximately 45 degrees respectively with respect to the sides of said base plate.

8. The assembly of claim 5 wherein each track of said set comprises a "T"-shaped recess.

9. The assembly of claim 5 wherein each track of said set comprises a slot.

10. The assembly of claim 8 wherein the plurality of heater bars comprises four heater bars situated so as to form a substantially rectangular cavity between the interior sides of the heater bars.

11. The assembly of claim 9 wherein the plurality of heater bars comprises four heater bars situated so as to form a substantially rectangular cavity between the interior sides of the heater bars.

* * * * *